United States Patent [19]

Tuttle et al.

[11] Patent Number: 5,356,839
[45] Date of Patent: Oct. 18, 1994

[54] ENHANCED QUALITY THIN FILM CU(IN,GA)SE$_2$ FOR SEMICONDUCTOR DEVICE APPLICATIONS BY VAPOR-PHASE RECRYSTALLIZATION

[75] Inventors: John R. Tuttle, Denver; Miguel A. Contreras; Rommel Noufi, both of Golden; David S. Albin, Denver, all of Colo.

[73] Assignee: Midwest Research Institute, Kansas City, Mo.

[21] Appl. No.: 45,860

[22] Filed: Apr. 12, 1993

[51] Int. Cl.$^5$ .............................. H01L 21/302
[52] U.S. Cl. ........................... 437/225; 437/5; 437/234; 136/260; 136/265; 136/258
[58] Field of Search ............... 437/225, 5, 103, 106, 437/234; 136/258 PC, 260, 265, 264

[56] References Cited

U.S. PATENT DOCUMENTS

| | | | |
|---|---|---|---|
| 4,465,575 | 8/1984 | Love et al. | 136/260 |
| 4,581,108 | 4/1986 | Kapur et al. | 136/260 |
| 4,703,131 | 10/1987 | Dursch | 136/258 |
| 4,915,745 | 4/1990 | Pollock et al. | 136/260 |
| 5,078,804 | 1/1992 | Chen et al. | 437/5 |

*Primary Examiner*—Tom Thomas
*Assistant Examiner*—Tuan Nguyen
*Attorney, Agent, or Firm*—Ken Richardson

[57] ABSTRACT

Enhanced quality thin films of $Cu_w(In,Ga_y)Se_z$ for semiconductor device applications are fabricated by initially forming a Cu-rich, phase-separated compound mixture comprising $Cu(In,Ga):Cu_xSe$ on a substrate to form a large-grain precursor and then converting the excess $Cu_xSe$ to $Cu(In,Ga)Se_2$ by exposing it to an activity of In and/or Ga, either in vapor In and/or Ga form or in solid $(In,Ga)_ySe_z$. Alternatively, the conversion can be made by sequential deposition of In and/or Ga and Se onto the phase-separated precursor. The conversion process is preferably performed in the temperature range of about 300°–600° C., where the $Cu(In,Ga)Se_2$ remains solid, while the excess $Cu_xSe$ is in a liquid flux. The characteristic of the resulting $Cu_w(In,Ga)_ySe_z$ can be controlled by the temperature. Higher temperatures, such as 500°–600° C., result in a nearly stoichiometric $Cu(In,Ga)Se_2$, whereas lower temperatures, such as 300°–400° C., result in a more Cu-poor compound, such as the $Cu_z(In,Ga)_4Se_7$ phase.

26 Claims, 3 Drawing Sheets

ENHANCED QUALITY THIN FILM CU(IN,GA)SE$_2$ FOR SEMICONDUCTOR DEVICE APPLICATIONS BY VAPOR-PHASE RECRYSTALLIZATION

CONTRACTUAL ORIGIN OF THE INVENTION

The United States Government has rights in this invention under Contract No. DE-AC02-83CH10093 between the U.S. Department of Energy and the National Renewable Energy Laboratory, a Division of Midwest Research Institute.

BACKGROUND OF THE INVENTION

1. Field of the Invention

The present invention is related generally to preparation of thin film compounds and more particularly to preparing thin film compounds of Cu(In,Ga)Se$_2$ in semiconductor devices.

2. Description of the Prior Art

Thin films of copper-indium-diselenide (CuInSe$_2$), copper-gallium-diselenide (CuGaSe$_2$), and copper-indium-gallium-diselenide (CuIn$_{1-x}$Ga$_x$Se$_2$), all of which are sometimes generically referred to as Cu(In,Ga)Se$_2$, have become the subject of considerable interest and study for semiconductor devices in recent years. They are of particular interest for photovoltaic device or solar cell absorber applications because of solar energy to electrical energy conversion efficiencies that have been shown to exceed 15% in active areas and to approach 14% in total areas, which is quite high for current state-of-the-art solar cell technologies. It is generally believed by persons skilled in this art that the best electronic device properties, thus the best conversion efficiencies, are obtained when the mole percent of copper is about equal to the mole percent of the indium, the gallium, or the combination of the indium and gallium in the Cu(In,Ga)Se$_2$ compound or alloy. The selenium content will not generally be important to the electronic properties of the semiconductor if the growth conditions supply sufficient selenium so that it comprises about 50 at. %) of the Cu(In,Ga)Se$_2$ compound to form the desired crystal lattice structures. Sulfur can also be, and sometimes is, substituted for the selenium, so the compound is sometimes referred to even more generically as Cu(In,Ga)(S,Se)$_2$ to comprise all of those possible combinations.

Although the growth of single crystal CuInSe$_2$ has been studied, such as in the U.S. Pat. No. 4,652,332, issued to T. Ciszek, the use of polycrystalline thin films is really more practical. Sputter depositing a ternary single phase CuInSe$_2$ layer, including the ability to determine the properties of the thin film, such as multilayer structures, by varying the sputter process parameters, is described by U.S. Pat. No. 4,818,357, issued to Case et al. However, the two fabrication methods of choice are: (1) Physical vapor deposition of the constituent elements, exemplified by the process disclosed in U.S. Pat. No. 5,141,564, issued to Chen et al., which is generally used as a research tool and (2) selenization of Cu/In metal precursors by either H$_2$Se gas or Se vapor. The selenization technology generally exemplified by the processes described in U.S. Pat. No. 4,798,660, issued to Ermer et al., U.S. Pat. No. 4,915,745, issued to Pollock et al., and the U.S. Pat. No. 5,045,409, issued to Eberspacher et al., is currently favored for manufacturing processes. However, thin films produced by the selenization processes usually suffer from macroscopic spacial nonuniformities that degrade performance and yield, and reproducible consistent quality from run to run is difficult to obtain and unpredictable.

SUMMARY OF THE INVENTION

Accordingly, it is a general object of this invention to provide a process that produces a better quality Cu(In,-Ga)Se$_2$ thin film more consistently and more predictably than previously known processes.

It is also an object of this invention to provide a method of producing high quality Cu(In,Ga)Se$_2$ homojunctions.

Another object of the present invention is to provide a process capable of fabricating films of Cu(In,Ga)Se$_2$ that are smooth and do not require additional processing for photovoltaic response that have applications in solar and nonsolar cell functions.

Still another object of this invention is to provide a process for producing high quality Cu(In,Ga)Se$_2$ thin films that does not require precise control of the ratio of Cu/(In,Ga) during processing, thus can be scaled up easily to production of large areas and to commercial quantities.

Additional object, advantages, and novel features of the present invention will be set forth in part in the description that follows and in part will become apparent to those skilled in the art upon examination of the following, or may be learned by the practice of the invention or may be realized and attained by means of the instrumentalities and in combinations particularly pointed out in the appended claims.

To achieve the foregoing and other objects and in accordance with the purpose of the present invention, as embodied and broadly described herein, the method of this invention may comprise the steps of forming a Cu-rich, phase-separated, compound mixture comprising Cu(In,Ga)Se$_2$:Cu$_x$Se on a substrate, and converting Cu$_x$Se in the mixture to Cu$_w$(In,Ga)$_y$Se$_z$ by exposing the Cu$_x$Se to (In,Ga) and Se. This conversion should be done at elevated temperatures, preferably in the range of 300°–600° C.

BRIEF DESCRIPTION OF THE DRAWINGS

The accompanying drawings, which are incorporated in and form a part of the specifications, illustrate the preferred embodiments of the present invention, and together with the description serve to explain the principles of the invention.

IN THE DRAWINGS

Figure 1:
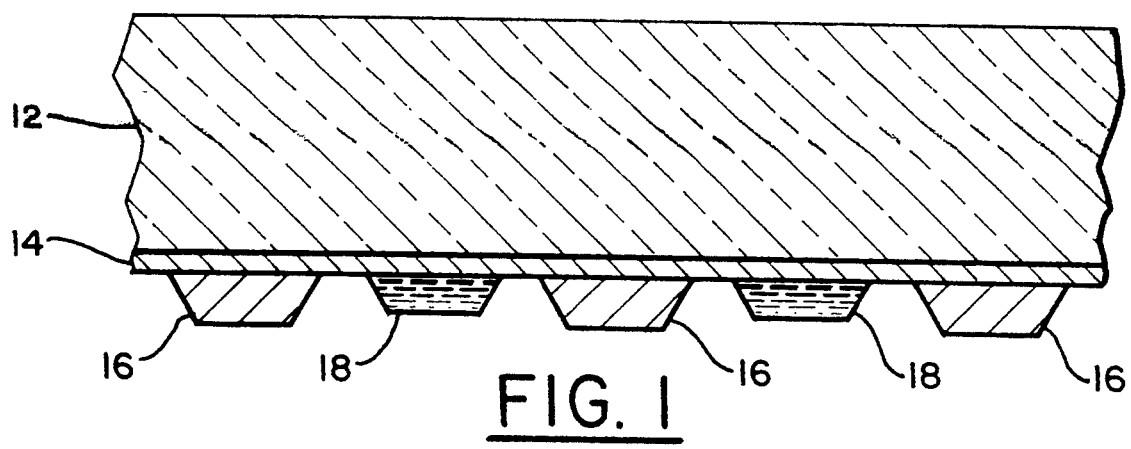
Figure 2:
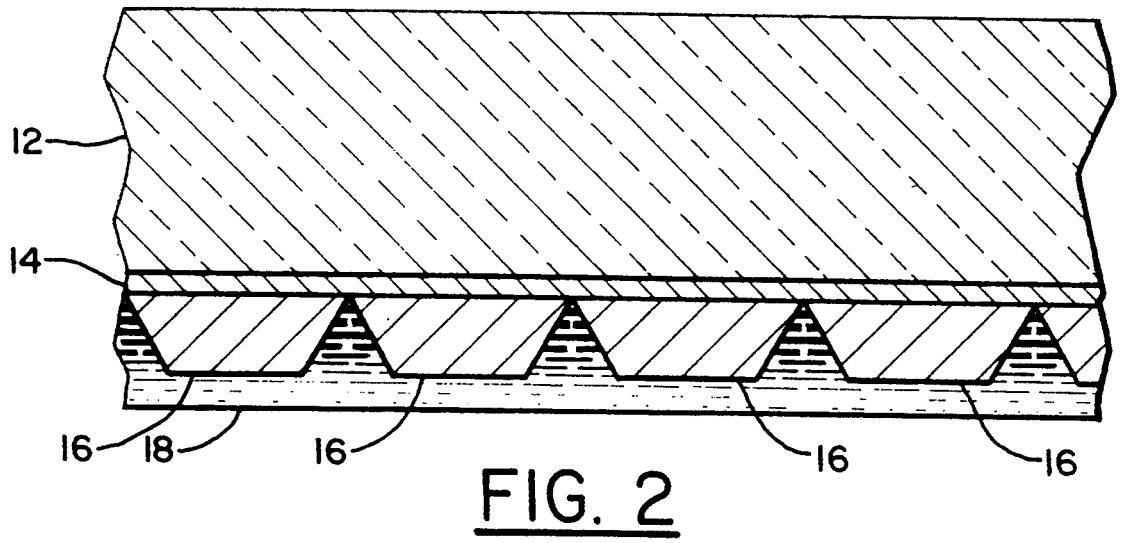
Figure 3:
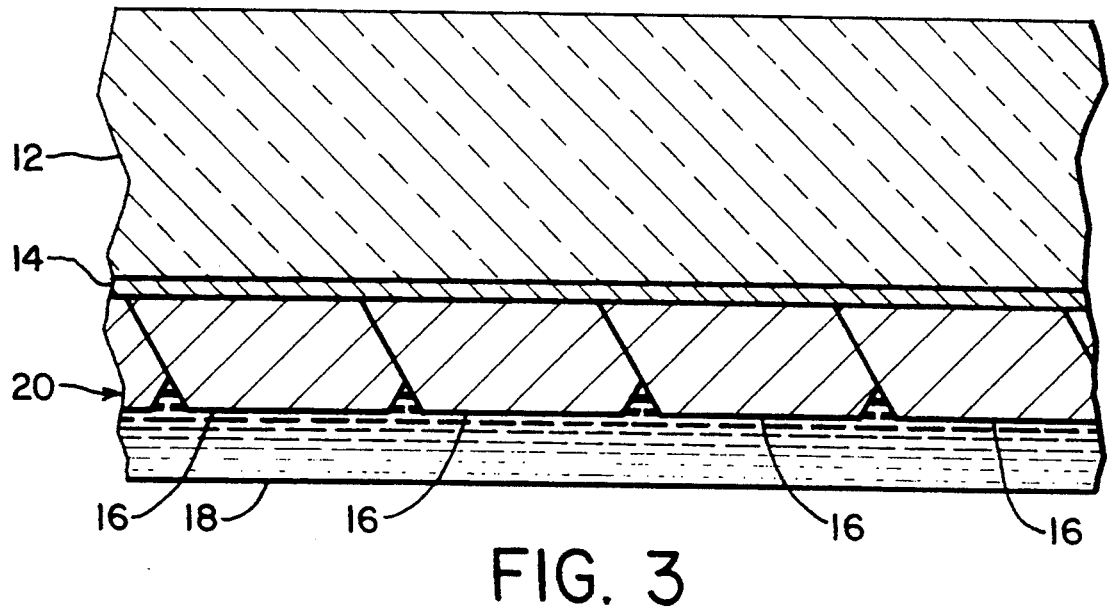
Figure 4:
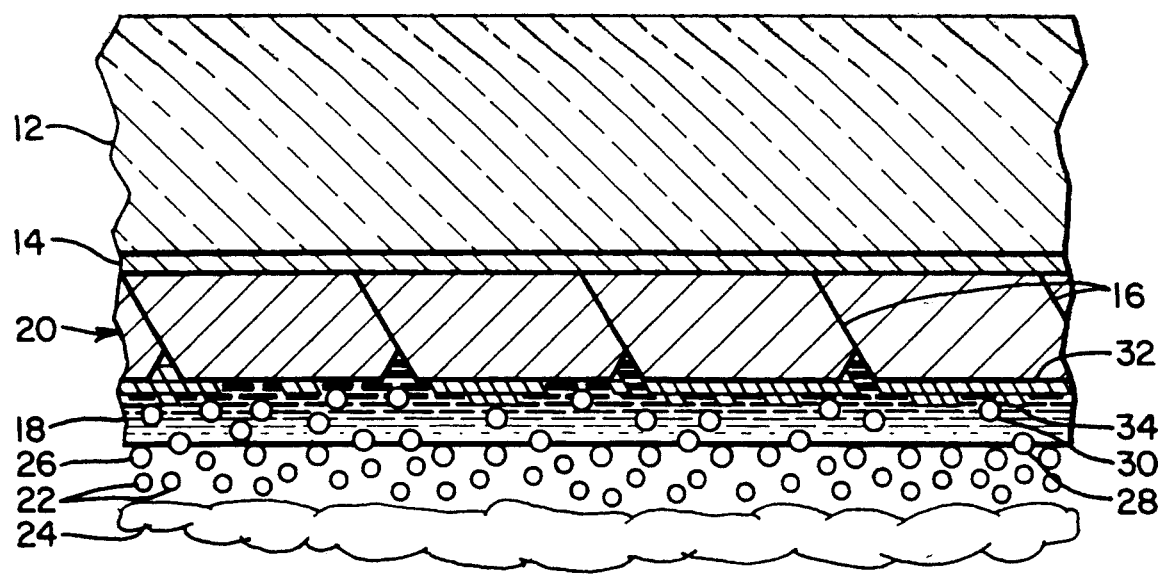
Figure 5:
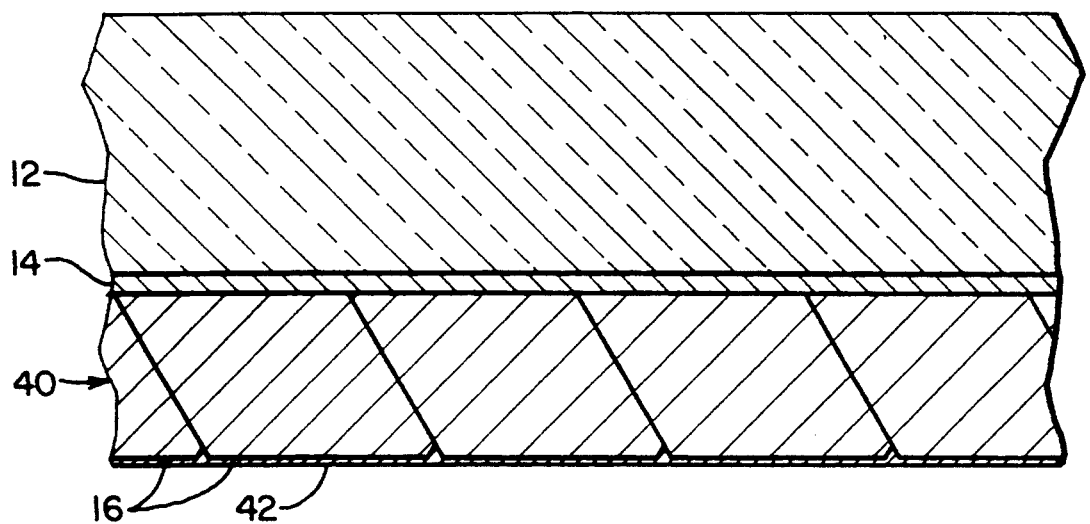
Figure 6:
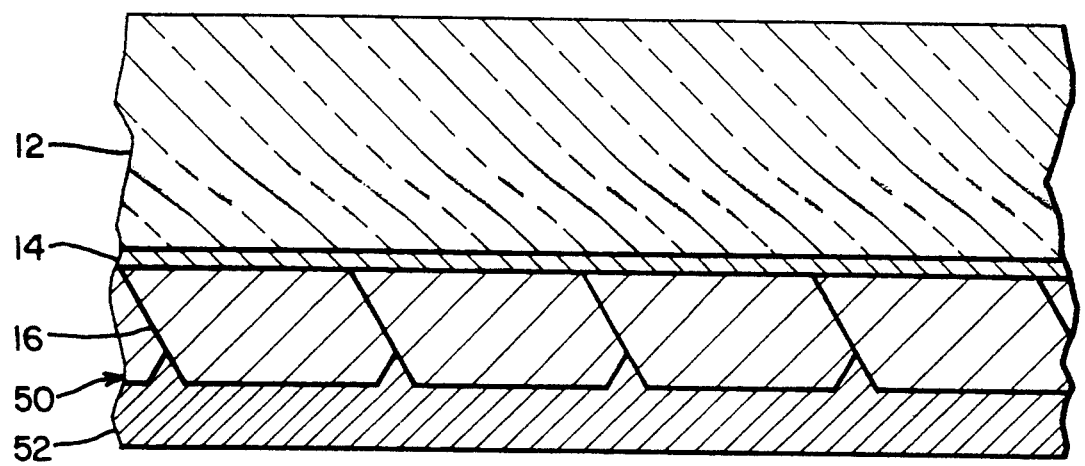
Figure 7:
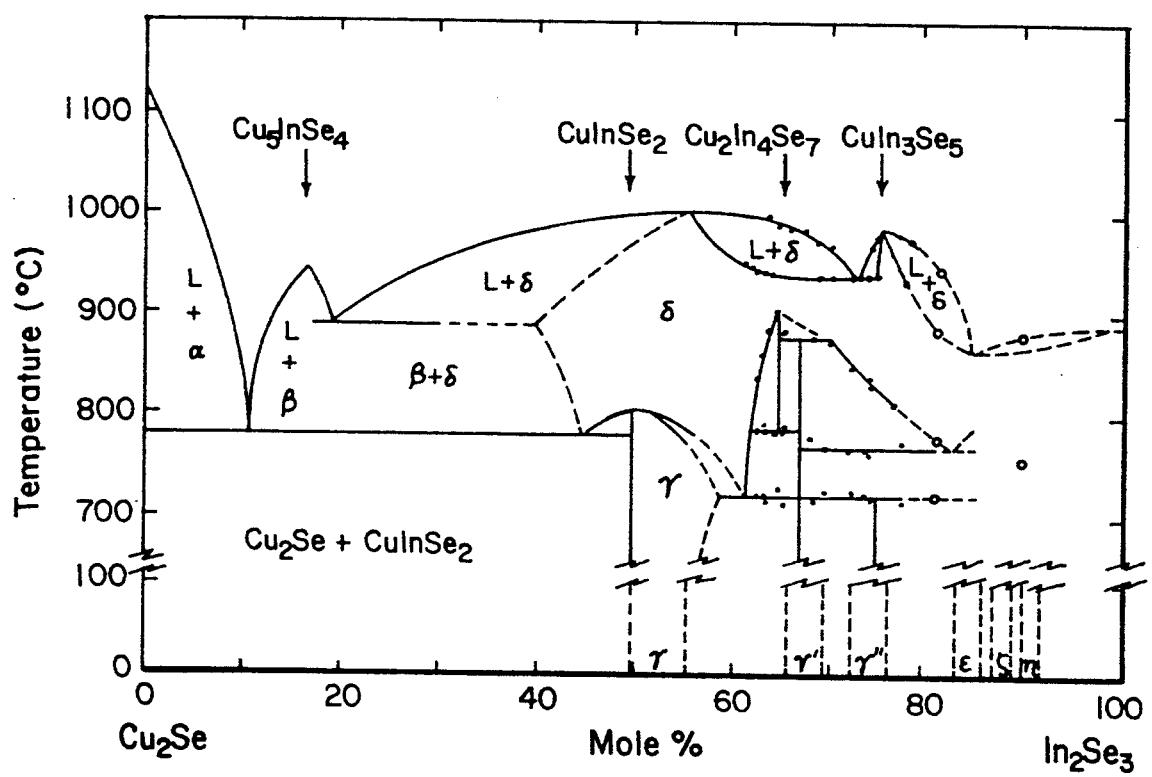

FIG. 1 is a cross-sectional view of a beginning stage of ternary two-phase polycrystalline growth of CuInSe$_2$:Cu$_x$Se on a conducting substrate in a first step of a preferred embodiment process according to the present invention;

FIG. 2 is a cross-sectional illustration of an intermediate polycrystalline growth stage of the first step of the preferred embodiment process of this invention;

FIG. 3 is a cross-sectional illustration of the final stage of the first step of the preferred embodiment process of this invention;

FIG. 4 is a cross-sectional illustration of the beginning of the second step of the preferred embodiment process of this invention;

FIG. 5 is a cross-sectional illustration of another optional resulting polycrystalline structure produced according to the present invention that is suitable for heterojunction applications;

FIG. 6 is a cross-sectional illustration of one optional resulting polycrystalline structure produced according to the present invention that is suitable for homojunction applications; and FIG. 7 is a $Cu_2Se$-$In_2Se_3$ pseudobinary phase diagram that is useful in describing and understanding the processes of the present invention.

DETAILED DESCRIPTION OF THE PREFERRED EMBODIMENTS

The processes of the present invention comprise essentially two steps for fabricating high-quality, thin film $Cu(In,Ga)Se_2$ - based semiconductor devices that have photovoltaic effects and are especially adaptable for solar cell applications. For purposes of simplicity, the description of the processes and claims of this invention will focus primarily on $CuInSe_2$ - based structures. However, it should be understood that Ga or various combinations of $In_{1-x}Ga_x$ may be substituted for the In component described in these processes and that such substitutions are considered to be equivalents for purposes of this invention. Also, as mentioned above, where several elements can be combined with or substituted for each other, such as In and Ga, in the component to which this invention is related, it is not uncommon in this art to include in a set of parentheses those elements that can be combined or interchanged, such as (In,Ga). The descriptions in this specification sometimes utilize this convenience. Finally, also for convenience, the elements are discussed with their commonly accepted chemical symbols, including copper (Cu), indium (In), gallium (Ga), selenium (Se), hydrogen (H), molybdenum (Mo), and the like.

The first step of this invention is to deposit or grow a high-conductivity, very Cu-rich, ternary, phase-separated mixture of monocrystalline or large-grain $[CuInSe_2]_{67}$ :$[Cu_xSe]_{1-\delta}$ ($0 \leq \delta \leq 1$, $1 \leq x \leq 2$), followed by an annealing and recrystallization of the $Cu_xSe$ phase. The second step includes keeping the temperature high enough to maintain a liquid-rich $Cu_xSe$ environment and depositing In-rich material, such as In and Se sequential or co deposition or the binary $In_ySe$, in a Se gas overpressure environment to form the desired $CuIn_xSe_y$ compound, as will be described in more detail below.

Referring now to FIG. 1, the first step of a preferred embodiment process according to this invention may start by beginning the deposition of the Cu-rich thin film of $CuInSe_2$:$Cu_xSe$ on a substrate 12. The substrate 12 may be, for example, soda-lime silica glass or amorphous 7059 glass. The deposition can be on the bare glass substrate 12, but it may be preferable to include a smooth metallic surface 14, such as a 2000 Å layer of Mo.

As illustrated in the phase diagram of FIG. 7, when the Cu, In, and Se components are in the Cu-rich range, i.e., where the mole % of In and Se is in the range between 0%-50%, and at temperatures under about 790° C., the $CuInSe_2$ and $Cu_xSe$ phases are separated. Therefore, as Cu, In, and Se are deposited on the Mo-coated substrate 12 in FIG. 1 in a very Cu-rich mixture, preferably comprising about 40-50 at. % Cu, at a substrate temperature greater than 500° C. (preferably about 500°-550° C.), the $CuInSe_2$ crystalline structures 16 grow separate from the $Cu_xSe$ crystalline structures 18, i.e., they are phase-separated. Also, the melting point of the $Cu_xSe$ is slightly lower than the melting point of $CuInSe_2$. Therefore, it is preferable to maintain the substrate in the above-described temperature range, where the $CuInSe_2$ is a solid, and the $Cu_xSe$ is substantially in a liquid flux. Then, as the deposition process continues, as illustrated in FIG. 2, the $CuInSe_2$ phase crystals 16 tend to grow together on the Mo layer 14, displacing the more liquid $Cu_xSe$ phase 18 outwardly. The end result of the deposition stage of the first step illustrated in FIG. 3, is a large-grain $CuInSe_2$ phase 16 adhered to the Mo coating 14 with an overlayer of the $Cu_xSe$ material 18 on its outer surface. If the $CuInSe_2$ and $Cu_xSe$ compounds are deposited sequentially or at lower temperatures, this structure is then preferably annealed in a Se atmosphere, such as Se or $H_2Se$ vapor, at a temperature of about 500°-550° C. In this annealing stage, any solid $Cu_xSe$ 18 is converted to liquid $Cu_xSe$, and a growth/recrystallization is believed to occur in a liquid flux environment of the $Cu_xSe$ binary phase. This growth/recrystallization process encourages monocrystalline (112), large-grain growth (2-10 μm), which is a superior morphology for device quality electronic properties. The resulting structure of FIG. 3 is referred to as the large-grain precursor 20, which forms the structural platform for a thin film electronic device fabricated according to the second step of this invention described below.

In the second step of a preferred embodiment of this invention, the excess $Cu_xSe$ 18 in the large-grain precursor structure 20 is converted to a $CuIn_ySe_z$ material by exposure to an activity of In and Se at elevated temperatures for a period of time, as illustrated in FIG. 4. The In and Se exposure can be in the form of In vapor 22 and Se vapor 24, as illustrated in FIG. 4, or it can be $In_ySe$ solid, such as the $In_2Se_3$ illustrated in FIG. 7, with no Cu content. With the substrate 12 and large-grain precursor structure 20 maintained in the range of about 300°-600° C., the $Cu_xSe$ overlayer 18 absorbs and combines with the In 22 to form the desired $CuIn_ySe_z$ material. Alternatively, this conversion of $Cu_xSe$ to a $CuIn_ySe_z$ material can be accomplished by sequential deposition of In and Se on the precursor structure 20. The characteristic of the $CuIn_ySe_z$ material can be controlled by maintaining the temperature during this second step of the process, as described below.

A high temperature treatment option of the second step of the process, such as in the range of about 500°-600° C., is illustrated in FIG. 4, and the resulting nearly homogenous film structure 40 is shown in FIG. 5. Essentially, at temperatures in the range of about 500°-600° C., preferably at about 550° C., the $Cu_xSe$ overlayer 18 forms a liquid flux, while the $CuInSe_2$ underlayer 16 remains substantially solid. The In vapor 22 condenses to liquid phase 26 at the surface of the $Cu_xSe$ overlayer 18. The liquid In 26 and Se gas 24 contacts the overlayer 18, where it combines at the surface with the excess $Cu_xSe$ to form additional $CuInSe_2$, as shown at 28. This new $CuInSe_2$ remains in solution while it diffuses, as shown at 30, through the $Cu_xSe$ overlayer 18 to the liquid-solid interface 32, where it nucleates and "epitaxial" builds on the original $CuInSe_2$ crystalline structures 16, as shown at 34. The nucleation can be described as:

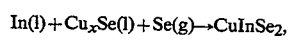

$$In(l) + Cu_xSe(l) + Se(g) \rightarrow CuInSe_2,$$

where (l) indicates liquid and (g) indicates gas. While it is not known for certain, it is believed that the lesser density of the $CuInSe_2$ in the $Cu_xSe$ assists in transferring the $CuInSe_2$ to the liquid-solid interface 38. In any event, this process results in a substantially continuous morphology homogenous film growth of the CuInSe$_2$ crystalline structures 16. When the liquid phase Cu$_x$Se in the overlayer 18 is substantially consumed, the resulting film structure 40 may be near stoichiometric with planar surfaces, as shown in FIG. 5. This recrystallization process is self-limiting in that, if the Se to In ratio is lowered, the process rejects In in the form of In$_y$Se when the surface converts from Cu-rich to Cu-poor. It may be slightly Cu-rich or slightly Cu-poor, depending on the extent of Cu$_x$Se recrystallization in this second step. However, the self-limiting nature of the reaction makes it unnecessary to regulate the In precisely, thus, the process is conducive to commercial processing. The nature of the surface 42 of structure 40 is known to be Cu-poor with a composition equivalent to the CuIn$_3$Se$_5$ phase and is nearly planar and smooth. Proper engineering of this surface can lead to a layer of CuIn$_3$Se$_5$ of sufficient thickness to produce a shallow homojunction, which in turn may not require the thin CdS buffer layer to make an operational solar cell. This film structure 40, which is essentially p-type CuInSe$_2$, can be used on one side of a heterojunction device, as will be obvious to persons having ordinary skill in this art, by overlaying it with a different material, such as a CdS and ZnO window layer (not shown).

A lower temperature treatment option in the second step of the process of this invention, such as in the range of about 300°–400° C., can produce a homojunction thin-film device 50, as shown in FIG. 6, that does not require a different material overlay, such as a CdS and ZnO window layer, to have photovoltaic characteristics. In this optional lower temperature range treatment, the conversion of excess Cu$_x$Se to a form of CuIn$_y$Se$_z$ is inhibited from approaching the stoichiometric ratio by the limited mobility of Cu at the lower temperatures, thus resulting in an overlayer 52 of very Cu-poor morphology, such as Cu$_2$In$_4$Se$_7$ in the $\gamma'$ range or CuIn$_3$Se$_5$ in the $\gamma''$ range of the phase diagram in FIG. 7. Such Cu-poor structures in the overlayer 52 are n-type materials, in contrast to the p-type Cu-rich CuInSe$_2$ crystalline structures 16 underlaying the n-type layer 52. Therefore, the interface between the underlayer 16 and overlayer 52 forms a homojunction, and the film structure 50 can function as a photovoltaic device.

There are numerous practical options and variations for fabricating thin film devices according to this invention. Substitution of Ga or a combination of In and Ga for the In described above, as well as the option of using Se vapor, H$_2$Se vapor, or In$_y$Se$_z$ solids, has already been mentioned. In addition, there are many options for deposition. For example, the deposition can be accomplished by sputtering of the two compounds CuInSe$_2$ and Cu$_x$Se in the first step, either concurrently or sequentially, followed by or concurrently with Se treatment, or by co-evaporation of the constituent elements in an overpressure of Se, or by any combination of methods that will produce a phase-separated mixture of these compounds.

In other variations, the initial deposition does not have to include both of the compounds Cu(In,Ga)Se$_2$ and Cu$_x$Se for the large-grain precursor mixture. It can start instead with an initial deposition of a binary Cu$_{2-\delta}$Se precursor as an extreme case of the Cu(In,Ga)Se$_2$:Cu$_{2-\delta}$Se large-grain precursor mixture, in which case the In and/or Ga would have to be added in a manner and at a temperature in which phase-separated Cu(In,Ga)Se$_2$:Cu$_x$Se would be produced on the substrate, such as by the addition of a small amount of In$_2$Se$_3$. Of course, the initial deposition of Cu$_{2-\delta}$Se should be at a lower temperature to get the desired large-grain formation. The formation of the precursor can be dissected further by the conversion of an elemental mixture of Cu(In,Ga), and Se to the compound mixture by exposure to Se vapor at elevated temperatures, or by the conversion of Cu and (In,Ga) to Cu(In,Ga)-Se$_2$ by exposure to H$_2$Se. At the other extreme, an initial deposition of In$_2$Se$_3$ could be made in conjunction with a larger amount of Cu$_2$Se. The goal, regardless of which combination or sequence of materials deposition is used, is to achieve the Cu-rich, phase-separated growth of the Cu(In,Ga)Se$_2$:Cu$_x$Se mixture in the first step of the process, so that the second step can proceed according to that portion of this invention. Also, additional Cu as well as, or instead of, the additional In can be incorporated in the second step.

EXAMPLES

Absorbers according to this invention were fabricated by a combination of physical vapor deposition and H$_2$Se/Se vapor selenization on 5-cm×5-cm (2-in×2-in) Mo-coated soda-lime silica (SLS) and bare 7059 glass at substrate temperatures in excess of 550° C. At times, an intentional one-dimensional compositional gradient was introduced across the 5-cm substrate to facilitate the study of novel device structures and the relationship between device parameters and film composition. Absorbers included CuInSe$_2$, CuIn$_{1-x}$Ga$_x$Se$_2$ (0.0≤x≤0.25), and CuGaSe$_2$/CuInSe$_2$ layered structures. Surface and bulk material characterization was accomplished by Auger electron spectroscopy (AES), X-ray and ultraviolet photoemission spectroscopy (XPS, UPS), X-ray and transmission-electron diffraction (XRD, TED), photoluminescence (PL), and analytical scanning electron microscopy (ASEM). Device characterization was accomplished by dark and light I-V and spectral response at temperatures down to 50K, capacitance-voltage, and deep-level transient spectroscopy (DLTS).

We were successful in producing device quality, CuInSe$_2$-based thin films on bare glass and Mo-coated SLS with columnar structures and a lateral grain size of 2.0–10.0 μm. XRD studies suggest monocrystalline behavior on bare substrates, and (112) high preferred orientation on Mo-coated substrates. XRD and TED confirmed the presence of a CuPt-type ordering of Cu and In planes within the bulk of the film. We attribute the creation of this phase to the high substrate temperatures and liquid-phase assisted growth processes present.

In film structures with an overall Cu-rich composition, the Cu$_2$Se binary phase was identified at the surface by XPS and within the bulk by EDS of thinned samples prepared in cross section for TED. In film structures with an overall Cu-poor composition, the CuIn$_2$Se$_{3.5}\gamma'$ ordered-vacancy compound (OVC) phase was observed in the bulk by XRD and TED, while the CuIn$_3$Se$_5\gamma''$ OVC is exclusively observed at the surface. Electrical characterization of the $\gamma'$ and $\gamma''$ phases [3] indicated enhanced transport properties and n-type behavior. Electrical activity within the grain and at grain-boundaries in these films was not discernibly different.

Process-dependent device structures included both sharp heterojunctions and deep homojunctions, with an observed space-charge width of up to 2.5 μm. Heterojunction cells were completed with either a thick CdS window layer deposited by physical vapor deposition, or with a chemical-bath deposition (CBD) CdS (700 Å)/ZnO (0.5 μm) layered window. Photovoltaic (PV) devices with conversion efficiencies in excess of 12% and most recently over 13.7% have been demonstrated. Films that were fabricated with an intentional compositional gradient exhibited an open-circuit voltage ($V_{oc}$) vs. composition dependence, while the short-circuit current ($J_{sc}$) remained constant over a wide compositional range. A very promising structure involved the growth of CuInGaSe$_2$ on CuGaSe$_2$. Open circuit voltages ranging from 550 to 630 mv and $J_{sc}$'s ranging from 37 to 30 mA/cm$^2$ have been observed, respectively. Thus result suggests total area device efficiencies greater than 15% are possible. The voltage parameter was significant in light of the analysis (AES depth profiling and spectral response), which measured a surface and content less than that usually required to obtain the device parameters quoted. It is suggested that a back-surface field from the CuGaSe$_2$ was contributing to the voltage enhancement of the CuInSe$_2$ absorber. We anticipate significant improvements in the near future as the processes are optimized.

We have been successful in producing enhanced-grain device-quality Cu(In,Ga)Se$_2$ by a simple two-stage process. The first stage of the process involved the growth of an enhanced-grain CuInSe$_2$ aggregate mixture. At high substrate temperatures, the growth of the CuInSe$_2$ occurred in a liquid rich environment, which accounted for the increase in average grain size of the film mixture. When the vapor flux became In-rich, the CuInSe$_2$ formed at the surface remained in solution while it diffused to the liquid-solid interface, where it condensed, nucleated and "epitaxial" built on the original CuInSe$_2$ surface. When the liquid phase was consumed, the process was terminated in some samples and in others by In diffusion into the bulk or by the growth of very Cu-poor phases near the surface. The latter step determined the homo- or hetero junction nature of the device. This generalized procedure may be applied to scalable manufacturing processes, like sputtering and selenization, in a very reproducible manner.

The foregoing description is considered as illustrative only of the principles of the invention. Further, since numerous modifications and changes will readily occur to those skilled in the art, it is not desired to limit the invention to the exact construction and process shown, as described above. Accordingly, all suitable modifications and equivalents may be resorted to falling within the scope of the invention as defined by the claims which follow.

The embodiments of the invention in which an exclusive property or privilege is claimed are defined as follows:

1. A process for fabricating thin film semiconductor devices, comprising the steps of:
    forming a Cu-rich, phase-separated, compound mixture comprising Cu(In,Ga)Se$_2$:Cu$_x$Se on a substrate; and
    converting Cu$_x$Se in the mixture to Cu$_w$(In,Ga)$_y$Se$_z$ by exposing said Cu$_x$Se to (In,Ca) and Se.

2. The process of claim 1, including the step of forming said mixture in a temperature range of about 500°–600° C.

3. The process of claim 1, including the step of converting said Cu$_x$Se to Cu$_w$(In,Ga)$_y$Se$_z$ in a temperature range of about 500°–600° C.

4. The process of claim 3, including the step of converting said Cu$_x$Se to Cu(In,Ga)Se$_2$.

5. The process of claim 1, including the step of converting said Cu$_x$Se to Cu$_w$(In,Ga)$_y$Se$_z$ in a temperature range of about 300°–400° C.

6. The process of claim 5, including the step of converting Cu$_x$Se to Cu$_2$(In, Ga)$_4$Se$_7$.

7. The process of claim 5, including the step of converting said Cu$_x$Se to Cu(In, Ga)$_3$Se$_5$.

8. The process of claim 7, where said Cu$_x$Se is further defined by $1 \leq x \leq 2$, and where said In$_y$Se$_z$ is further defined by y=2 and z=3.

9. The process of claim 1, wherein $1 \leq x \leq 2$.

10. The process of claim 1, wherein the ratio of Cu(In,Ga)$_2$:Cu$_x$Se is about 1:2.

11. The process of claim 1, wherein Cu comprises about 40–50 at. % of said mixture.

12. The process of claim 1, including the step of exposing said Cu$_x$Se to In$_y$Se$_z$.

13. The process of claim 12, including the step of exposing said Cu$_x$Se to In$_2$Se$_3$.

14. The process of claim 1, including the step of exposing said Cu$_x$Se to In vapor and Se vapor.

15. The process of claim 1, including the step of forming said mixture by depositing said Cu(In,Ga)Se$_2$ and said Cu$_x$Se on said substrate.

16. The process of claim 15, including the step of forming said mixture by depositing Cu(In,Ga)Se$_2$ and Cu$_x$Se on said substrate simultaneously.

17. The process of claim 15, including the step of forming said mixture by depositing Cu(In,Ga)Se$_2$ and Cu$_x$Se sequentially.

18. The process of claim 15, including the step of depositing said Cu(In,Ga)Se$_2$ by depositing an elemental mixture of Cu and (In,Ga) and exposing said mixture to Se.

19. The process of claim 15, including the step of depositing said mixture by sputtering.

20. The process of claim 15, including the step of depositing said mixture by physical co-evaporation.

21. The process of claim 1, including the step of forming said mixture by depositing Cu$_x$Se and In$_y$Se$_z$.

22. The process of claim 21, including the step of depositing said Cu$_x$Se and said In$_y$Se$_z$ sequentially.

23. The process of claim 21, including the step of depositing said Cu$_x$Se and said In$_y$Se$_z$ simultaneously.

24. The process of claim 21, including the step of depositing said Cu$_x$Se by first depositing Cu and then exposing said Cu to Se.

25. The process of claim 1, wherein said substrate comprises glass.

26. The process of claim 25, wherein said substrate comprises a Mo coating on said glass.

* * * * *

UNITED STATES PATENT AND TRADEMARK OFFICE
CERTIFICATE OF CORRECTION

PATENT NO. : 5,356,839
DATED : October 18, 1994
INVENTOR(S) : Tuttle et al.

It is certified that error appears in the above-indentified patent and that said Letters Patent is hereby corrected as shown below:

On title page, item [56]

In the References Cited:

Add the following references:

| | | | |
|---|---|---|---|
| 4,652,332 | 3/1987 | Ciszek | 156/607 |
| 4,687,881 | 8/1987 | Goslowsky et al. | 136/255 |
| 4,798,660 | 1/1989 | Ermer et al. | 204/192.17 |
| 4,818,357 | 4/1989 | Case et al. | 204/192.25 |
| 4,909,863 | 3/1990 | Birkmire et al. | 148/33.4 |
| 4,940,604 | 7/1990 | Suyama et al. | 427/76 |
| 5,028,274 | 7/1991 | Basol et al. | 136/264 |
| 5,045,409 | 9/1991 | Eberspacher et al. | 428/620 |

In the Abstract:

In line 14, change "$Cu_w(In,Ga)_y Se_z$" to --$Cu_x(In,Ga)_y Se_z$--.

In column 1, line 41, change "at. %)" to --at. %--.

In column 2, line 37, change "$Cu_w(In,Ga)_y Se_z$" to --$Cu_x(In,Ga)_y Se_z$--.

UNITED STATES PATENT AND TRADEMARK OFFICE
CERTIFICATE OF CORRECTION

PATENT NO. : 5,356,839
DATED : October 18, 1994
INVENTOR(S) : Tuttle et al.

It is certified that error appears in the above-indentified patent and that said Letters Patent is hereby corrected as shown below:

In column 3, line 37, change "$[CuInSe_2]_{67}$:" to --$[CuInSe_2]_\delta$:--.

In column 3, line 66, change "18," to --18;--.

In column 5, line 16, change "CU-poor" to --Cu-poor--.

In column 6, line 2, change "$Cu_{2-8}$ Se" to --$Cu_{2-\delta}Se$--.

In column 6, line 64, change "grain-boundaries" to --grain boundaries--.

In claim 6, line 2, change "$Cu_2(In, Ga)_4Se_7$" to --$Cu_2(In,Ga)_4Se_7$--.

UNITED STATES PATENT AND TRADEMARK OFFICE
CERTIFICATE OF CORRECTION

PATENT NO. : 5,356,839
DATED : October 18, 1994
INVENTOR(S) : Tuttle et al.

It is certified that error appears in the above-indentified patent and that said Letters Patent is hereby corrected as shown below:

Column 8, line 17,

In claim 7, line 2, change "$Cu(In, Ga)_3Se_5$" to --$Cu(In,Ga)_3Se_5$--.

Signed and Sealed this

Sixth Day of June, 1995

Attest:

BRUCE LEHMAN

Attesting Officer    Commissioner of Patents and Trademarks